(12) United States Patent
Takeuchi et al.

(10) Patent No.: US 6,528,925 B1
(45) Date of Patent: Mar. 4, 2003

(54) PIEZOELECTRIC/ELECTROSTRICTIVE ELEMENT DRIVING CIRCUIT

(75) Inventors: Yukihisa Takeuchi, Aichi-ken (JP); Iwao Ohwada, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/635,752

(22) Filed: Aug. 10, 2000

(30) Foreign Application Priority Data

Aug. 20, 1999 (JP) .......................................... 11-234447

(51) Int. Cl.[7] .............................................. H01L 41/08
(52) U.S. Cl. ................................. 310/316.03; 310/318
(58) Field of Search .......................... 310/316.03, 318, 310/319

(56) References Cited

U.S. PATENT DOCUMENTS

| 3,589,345 | A | * | 6/1971 | Benson | 123/478 |
| 5,130,598 | A | * | 7/1992 | Verheyen et al. | 310/316 |
| 5,245,242 | A | * | 9/1993 | Hall | 310/316 |
| 6,081,061 | A | * | 6/2000 | Reineke et al. | 310/316.03 |
| 6,276,772 | B1 | * | 8/2001 | Sakata et al. | 347/10 |

FOREIGN PATENT DOCUMENTS

| JP | 4-039060 | 2/1992 |
| JP | 10-107335 | 4/1998 |

* cited by examiner

*Primary Examiner*—Mark O. Budd
(74) *Attorney, Agent, or Firm*—Burr & Brown

(57) ABSTRACT

A first charging circuit and a third charging circuit are provided as first-step charging circuits to first and second piezoelectric/electrostrictive elements, and a second charging circuit and a fourth charging circuit are provided as next-step charging circuits. Moreover, the first-step charging circuits of the piezoelectric/electrostrictive elements serve also as first-step discharging circuits, and a first discharging circuit and a second discharging circuit are provided as next-step discharging circuits. Resistances as well as coils intervene in the first charging circuit and the third charging circuit in a series with the piezoelectric/electrostrictive elements.

6 Claims, 2 Drawing Sheets

PIEZOELECTRIC/ELECTROSTRICTIVE ELEMENT DRIVING CIRCUIT

FIELD OF THE INVENTION

The present invention relates to a piezoelectric/electrostrictive element driving circuit which is used for actuators, transducers, various vibrators, micro-machines and the like.

BACKGROUND OF THE INVENTION

In actuators, transducers, various vibrators and micromachines which are driven by piezoelectric elements or electrostrictive elements (piezoelectric/electrostrictive element), for example, the piezoelectric/electrostrictive element is charged and discharged to be deformed, and shifts and movements are made possible by utilizing this deformation. In such a driving circuit, where the piezoelectric/electrostrictive element is charged and discharged, if discharging electric charges are discharged as Joule heat by resistance or the like, the power consumption becomes large and the calorific value becomes large. For this reason, the discharging electric charges are prevented from being discharged as heat as much as possible, and they are recovered to be utilized as the next charging power, and the power consumption is reduced.

For example, in Japanese Patent No. 2909150, a plurality of piezoelectric elements are actuated at different times so that the discharging electric charges of the piezoelectric elements are directly used for charging other piezoelectric elements. As a result, energy which is consumed as heat by exchanging the electric charges between the piezoelectric elements is reduced. Moreover, Japanese Patent Application Laid-Open No. 10-107335 (1998) discloses a circuit in which a capacitor used exclusively for the recovery of charging electric charges is provided, and some discharging electric charges of the piezoelectric elements are stored in this capacitor to be utilized for next charging. Further, this circuit is configured so that a coil is provided in a charging/discharging circuit, and the recovered electric charge amount and reused electric charge amount are increased by LC resonance.

However, where a plurality of piezoelectric elements are provided and electric charges are exchanged between the piezoelectric elements, the power recovery efficiency is 50% at most. Where the capacitor exclusively for the recovery of electric charges is provided, when a coil is provided, the power recovery efficiency can be raised to about 90% maximally, but since this circuit requires an external capacitor, it is not suitable for miniaturization. Moreover, if both the structures are combined, a structure in which a coil is provided to the circuit where the electric charges are exchanged between the piezoelectric elements is obtained. However, with this structure, the charging/discharging timing between the piezoelectric elements is restricted, and it is difficult to optimize the charging/discharging waveform.

SUMMARY OF THE INVENTION

The present invention has been devised from the above viewpoint. It is an object of the present invention to provide a piezoelectric element driving circuit in which power recovery efficiency is high, power consumption is small, the degree of freedom of charging/discharging timing is high, and external elements (such as a capacitor for recovering a power) are not required.

In order to solve the above problem, a first aspect of the invention provides a piezoelectric/electrostrictive element driving circuit, characterized by including piezoelectric/electrostrictive elements which operate alternatively, a plurality of steps of charging circuits for charging the piezoelectric/electrostrictive elements, and a plurality steps of discharging circuits for discharging the piezoelectric/electrostrictive elements. At least the first-step charging circuit of the charging circuits and discharging circuits is connected with a resistance/resistances and a coil/coils in series with the piezoelectric/electrostrictive elements, and serves as the first-step discharging circuit of the other piezoelectric/electrostrictive elements mutually, and the discharging electrical charges on one side can be used directly as charging electrical charges on the other side.

BRIEF DESCRIPTION OF THE DRAWINGS

FIGS. 2(a) and 2(b) are applied voltage characteristic charts of the piezoelectric/electrostrictive element, and FIG. 2(c) is an operating chart of respective switches.

DETAILED DESCRIPTION OF THE INVENTION

Figure 1:
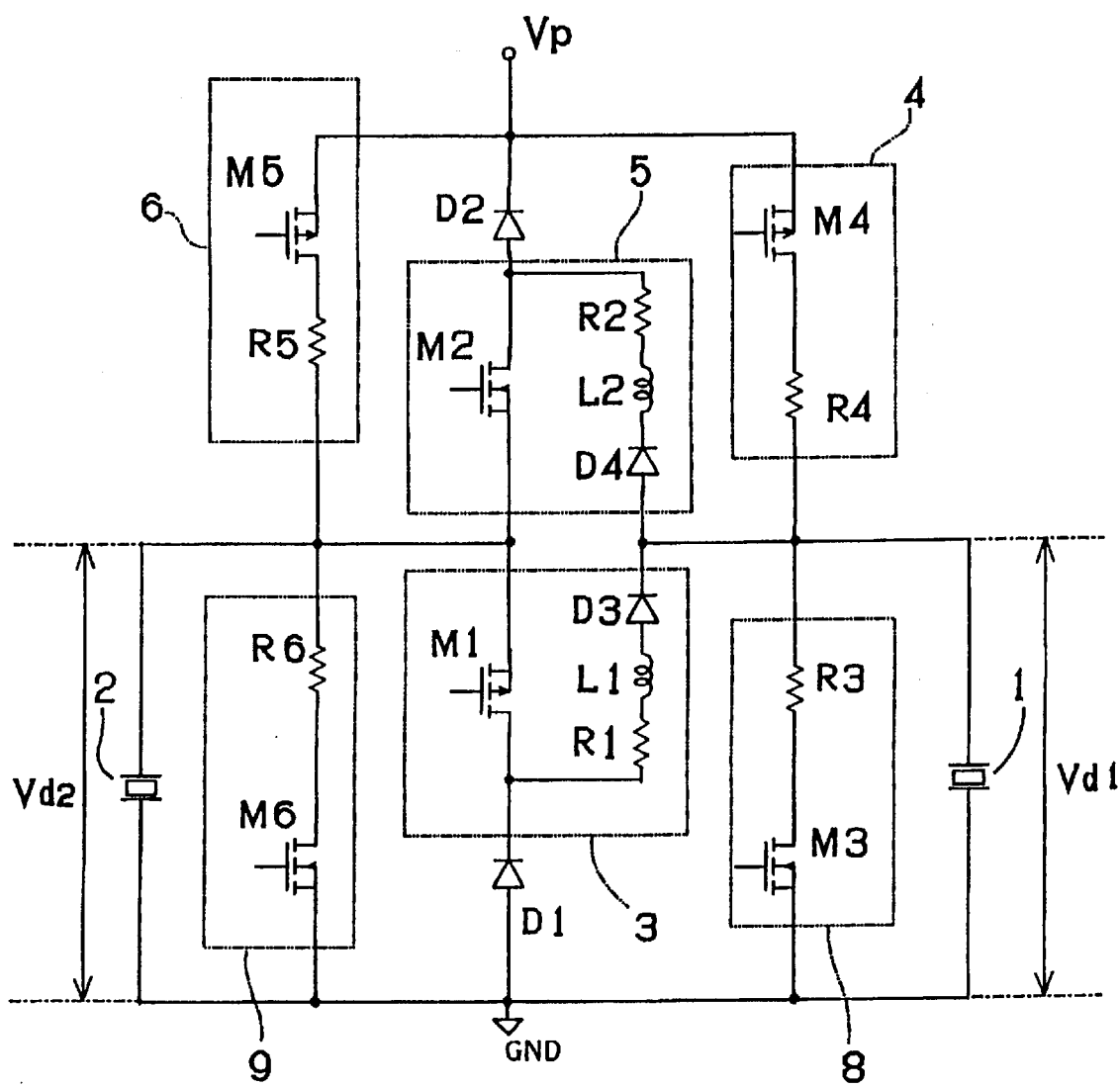
FIG. 1 is a circuit diagram of a piezoelectric/electrostrictive driving circuit according to an embodiment of the present invention.

An embodiment of the present invention is described in detail below with reference to the drawings. FIG. 1 shows a piezoelectric/electrostrictive element driving circuit of the present invention, including a first piezoelectric/electrostrictive element 1, a second piezoelectric/electrostrictive element 2, switches M1 through M6 composed of MOS type FET, and a power-supply voltage Vp.

The switch M1 is a control switch of a first charging circuit 3 for first charging the first piezoelectric/electrostrictive element 1, and the switch M4 is a control switch of a second charging circuit 4 for finally charging the first piezoelectric/electrostrictive element 1. The switch M2 is a control switch of a third charging circuit 5 for first changing the second piezoelectric/electrostrictive element 2, and the switch M5 is a control switch of a fourth charging circuit 6 for finally charging the second piezoelectric/electrostrictive element 2. Both the piezoelectric/electrostrictive elements have two steps of the charging circuits.

In addition, the first charging circuit 3 serves ala discharging circuit for first discharging the second piezoelectric/electrostrictive element 2, and the third charging circuit 5 serves ala discharging circuit for first discharging the first piezoelectric/electrostrictive element 1.

Namely, some or most of the electric charges which are charged into the second piezoelectric/electrostrictive element 2 become charging electric charges for the first piezoelectric/electrostrictive element 1. Some or most of the electric charges which are charged into the first piezoelectric/electrostrictive element 1 become charging electric charges of the second piezoelectric/electrostrictive element 2.

Further, the switch M3 is a control switch of a first discharging circuit 8 for completely discharging the first piezoelectric/electrostrictive element 1, and the switch M6 is a control switch of a second discharging circuit 9 for completely discharging the second piezoelectric/electrostrictive element 2.

Resistances R1 through R6 with capacitances C1 and C2 for the first and second piezoelectric/electrostrictive elements 1 and 2, respectively, determine charging/discharging curves with respect to time. The charging curve of the first piezoelectric/electrostrictive element 1 is determined by a characteristic due to the capacitance C1, the resistance R1 and a coil L1, and by a characteristic due to the capacitance C1 and the resistance R4. The discharging curve is determined by a characteristic due to the capacitance C1, the resistance R2 and a coil L2, and by a characteristic due to the capacitance C1 and the resistance R3. Moreover, the charging curve of the second piezoelectric/electrostrictive element 2 is determined by a characteristic due to the capacitance C2, the resistance R2 and the coil L2, and by a characteristic due to the capacitance C2 and the resistance R5. The discharging curve is determined by a characteristic due to the capacitance C2, the resistance R1 and the coil L1, and by a characteristic due to the capacitance C2 and the resistance R6. The charging time and discharging time of the respective piezoelectric/electrostrictive elements are determined by the above characteristics.

The coil L1 is provided to the first charging circuit 3 in series with the resistance R1, and the coil L2 is provided to the third charging circuit 5 in series with the resistance R2. The coils and the capacitances C1 and C2 of the piezoelectric/electrostrictive elements form an LC resonance circuit.

The switches M1, M4 and M5 are formed by P-MOS, and the switches M2, M3 and M6 are formed by N-MOS, and they are brought into the on/off state by a microcomputer, not shown. Moreover, D1 through D4 are diodes for preventing reverse current.

Figure 2:
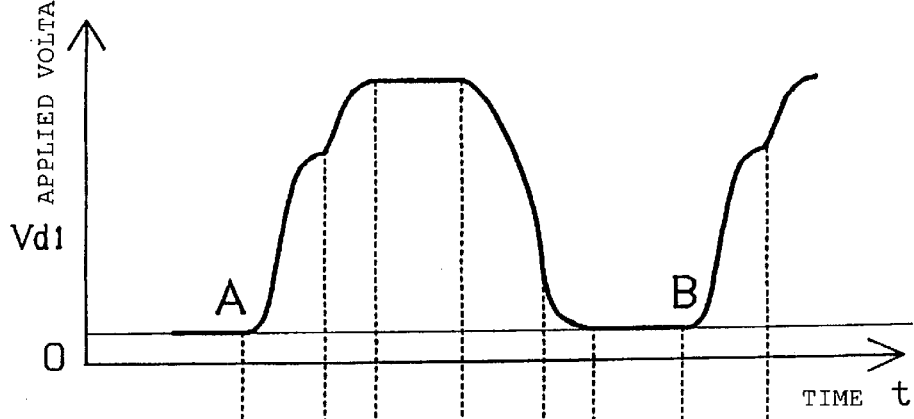
FIG. 2 shows the operating characteristics of the driving circuit in FIG. 1.
Figure 2:
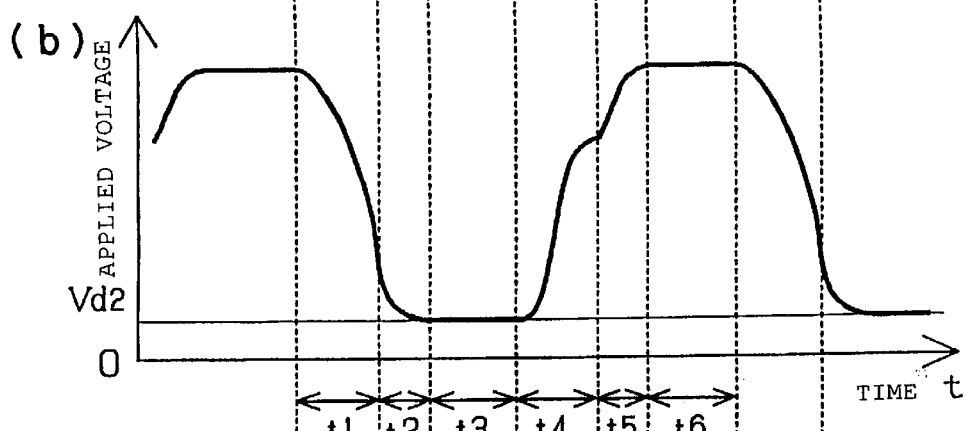
Figure 2:
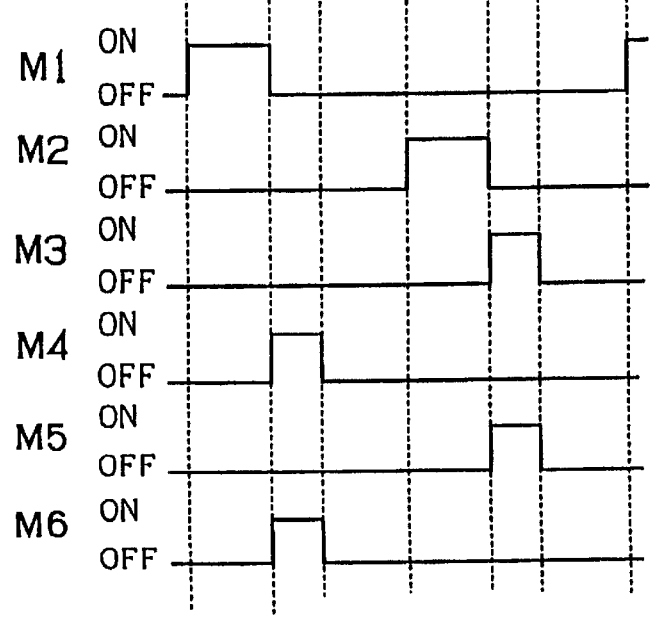

FIG. 2 shows operating characteristics of the driving circuit; FIGS. 2(a) and (b) show an applied voltage waveform for the first and second piezoelectric/electrostrictive elements 1 and 2, and FIG. 2(c) shows the on/off operation of the respective switches. The explanation will be given in the case where a point A is the starting point. The first charging time, t1, represents when the switch MI is turned on to operate the first charging circuit 3, and the charged electric charges of the second piezoelectric/electrostrictive element 2 are discharged to charge the first piezoelectric/electrostrictive element 1. Since the circuit has the coil L1, an electrical current amount at this time can be not less than 50% of the final charged electric charge amount of the second piezoelectric/electrostrictive element 2 due to the LC resonance effect.

The second charging time, t2, that represents the switch M1 is turned off and the switches M4 and M6 are turned on, to finally charge the first piezoelectric/electrostrictive element 1 to a voltage close to the power-supply voltage Vp, and to completely discharge the second piezoelectric/electrostrictive element 2. Here, time constant C1×R4 and time constant C2×R6 may obtain the different values, and t2 can be determined independently and may be different between the first and second piezoelectric/electrostrictive elements. Since t2 can be determined independently, the charging/discharging curves of the first and second piezoelectric/electrostrictive elements can be set without restricting each other. The holding time for holding a state of electric charge in C1 and C2 is t3, and t4 is third charging time when the switch M2 is turned on to operate the third charging circuit 5, and the charged electric charges of the first piezoelectric/electrostrictive element 1 are discharged to charge the second piezoelectric/electrostrictive element 2. Since this circuit has the coil L2, an electrical current amount can be not less than 50% of the finally charged electric charge amount of the first piezoelectric/electrostrictive element due to the LC resonance effect.

The fourth charging time, t5, represents when the switch M5 is turned on to finally charge the second piezoelectric/electrostrictive element 2, and the switch M3 is turned on to completely discharge the first piezoelectric/electrostrictive element 1. Here, time constant C2×R5 and time constant C1×R3 may obtain different values, and t5 can be determined independently and may be different between the first and second piezoelectric/electrostrictive elements. Since the charging time t5 can be determined independently, the charging/discharging curves of the first and second piezoelectric/electrostrictive elements can be set without restricting each other.

Time t6 is the holding time for holding a state of holding electric charge in C1 and C2, and after the holding time t6 reaches the ending point B, one period is completed. Thereafter, the above switching operations are repeated, and a period T repeats in the applied voltage waveform.

In such a manner, the piezoelectric/electrostrictive elements which operate alternatively are provided to form the charging circuit and the discharging circuit of the piezoelectric/electrostrictive elements at two steps. For this reason, even if the electric charges are moved mutually and the power consumption is reduced, the driving waveforms of the rising time, the falling time and the like of the applied voltage of the piezoelectric/electrostrictive elements are not unduly restricted. As a result, the optimal applied voltage waveform can be formed.

In addition, the coils are provided so that the power recovery efficiency can be improved, and an external capacitor is not required. As a result, the circuit can be miniaturized to be particularly suitable for the driving circuit of a micro machine and the like. Further, the time constant at the time of charging and discharging, other than the time that the first and third charging circuits operate, can obtain different values independently in the first and second piezoelectric/electrostrictive elements. For this reason, the degree of freedom of the charging/discharging timing can be increased, and the optimized waveforms can be easily formed for the respective elements. Moreover, when this circuit is adopted into an actuator, the actuator can be moved at high speed without ringing, and in micro-machines, transducers and various vibrators, an external capacitor is not required and the circuit operates while recovering the electric power. For this reason, the circuit can be miniaturized easily.

In this embodiment, the coils are provided respectively to the first and third charging circuits, but the coil may be additionally provided to another charging circuit or discharging circuit according to a target voltage waveform. Moreover, the charging and discharging circuits are formed at two steps, but the number of steps may be increased, and the number of steps may be different between the charging circuit and the discharging circuit.

Further, the switches are formed by MOS type FET, but the switches are not limited to this, and they may be formed by transistors. Two piezoelectric/electrostrictive elements are provided, but a plurality of piezoelectric elements and/or a plurality of electrostrictive elements may be used alternatively.

As detailed above, according to one aspect of the present invention, the charging and discharging waveforms are plural-steps waveforms, and the charging/discharging curves, other than the first-step charging waveform and discharging waveform, can be set independently. For this reason, the degree of freedom of the charging/discharging timing is high, and the optimal waveforms for the piezoelectric/electrostrictive elements can be easily formed. Moreover, the coils are provided so that the power recovery efficiency can be improved. Further, since an external capacitor is not required, the circuit can be miniaturized, and this circuit is suitable for driving circuits of actuators, transducers, various vibrators, micro-machines and the like which require miniaturization.

What is claimed is:

1. A piezoelectric/electrostrictive element driving circuit, comprising:

a voltage source;

first and second piezoelectric/electrostrictive elements;

a first charging circuit for charging said first piezoelectric/electrostrictive element;

a second charging circuit, independent of said first charging circuit, for charging said first piezoelectric/electrostrictive element;

at least one discharging circuit for discharging said first piezoelectric/electrostrictive element;

a third charging circuit for charging said second piezoelectric/electrostrictive element;

a fourth charging circuit, independent of said third charging circuit, for charging said second piezoelectric/electrostrictive element;

at least one discharging circuit for discharging said second piezoelectric/electrostrictive element;

wherein current discharged from said first piezoelectric/electrostrictive element flows to said second piezoelectric/electrostrictive element through said third charging circuit, and current discharged from said second piezoelectric/electrostrictive element flows to said first piezoelectric/electrostrictive element through said first charging circuit.

2. The piezoelectric/electrostrictive element driving circuit according to claim 1, wherein current flows from said voltage source to said first piezoelectric/electrostrictive element through said second charging circuit, and current flows from said voltage source to said second piezoelectric/electrostrictive element through said fourth charging circuit.

3. The piezoelectric/electrostrictive element driving circuit according to claim 1, wherein the charging voltage waveform applied to said first piezoelectric/electrostrictive element is different from the charging voltage waveform applied to said second piezoelectric/electrostrictive element.

4. The piezoelectric/electrostrictive element driving circuit according to claim 1, wherein the charging voltage waveform applied to said first piezoelectric/electrostrictive element has a shape that differs from the shape of the discharging voltage waveform of said first piezoelectric/electrostrictive element.

5. The piezoelectric/electrostrictive element driving circuit according to claim 1, wherein the charging voltage waveform applied to said second piezoelectric/electrostrictive element has a shape that differs from the shape of the discharging voltage waveform of said second piezoelectric/electrostrictive element.

6. A piezoelectric/electrostrictive element driving circuit, comprising:

a voltage source;

first and second piezoelectric/electrostrictive elements;

a first charging circuit for charging said first piezoelectric/electrostrictive element;

a second charging circuit independent of said first charging circuit, for charging said first piezoelectric/electrostrictive element; and at least one discharging circuit for discharging said first piezoelectric/electrostrictive element;

wherein current discharged from said first piezoelectric/electrostrictive element flows to said second piezoelectric/electrostrictive element, and current discharged from said second piezoelectric/electrostrictive element flows to said first piezoelectric/electrostrictive element through said first charging circuit.

* * * * *